(12) United States Patent
Nemoto et al.

(10) Patent No.: US 9,529,022 B2
(45) Date of Patent: Dec. 27, 2016

(54) SENSOR DEVICE WITH INDUCTORS

(71) Applicant: Renesas Electronics Corporation, Kawasaki-shi, Kanagawa (JP)

(72) Inventors: Takatsugu Nemoto, Kanagawa (JP); Yasutaka Nakashiba, Kanagawa (JP); Takasuke Hashimoto, Kanagawa (JP); Shinichi Uchida, Kanagawa (JP)

(73) Assignee: Renesas Electronics Corporation, Tokyo (JP)

( * ) Notice: Subject to any disclaimer, the term of this patent is extended or adjusted under 35 U.S.C. 154(b) by 64 days.

(21) Appl. No.: 14/477,538

(22) Filed: Sep. 4, 2014

(65) Prior Publication Data

US 2015/0061645 A1    Mar. 5, 2015

(30) Foreign Application Priority Data

Sep. 5, 2013  (JP) ................................ 2013-184217

(51) Int. Cl.
  *G01R 1/20* (2006.01)
  *G01R 19/00* (2006.01)
  *G01R 15/18* (2006.01)

(52) U.S. Cl.
  CPC ........... *G01R 19/0092* (2013.01); *G01R 1/203* (2013.01); *G01R 15/181* (2013.01)

(58) Field of Classification Search
  CPC ............................ G01R 15/181; G01R 15/202
  See application file for complete search history.

(56) References Cited

U.S. PATENT DOCUMENTS

| 6,424,018 | B1* | 7/2002 | Ohtsuka | G01R 15/202 |
| | | | | 257/421 |
| 2009/0001962 | A1* | 1/2009 | Dupuis | G01R 15/181 |
| | | | | 324/117 R |
| 2009/0284248 | A1* | 11/2009 | Etter | G01R 15/181 |
| | | | | 324/126 |

FOREIGN PATENT DOCUMENTS

JP        2011-185914 A        9/2011

* cited by examiner

*Primary Examiner* — Minh N Tang
(74) *Attorney, Agent, or Firm* — Shapiro, Gabor and Rosenberger, PLLC (57) ABSTRACT

This invention provides a sensor device at reduced cost. The sensor device includes a printed circuit board, a first terminal, a second terminal, an interconnect line, and a semiconductor device. The first terminal and second terminal are provided on the printed circuit board and coupled to a power line. The second terminal is coupled to a downstream part of the power line with respect to the first terminal. The interconnect line is disposed on the printed circuit board to couple the first terminal and second terminal to each other. In other words, the interconnect line is coupled to the power line in parallel. The semiconductor device is mounted on the printed circuit board and includes an interconnect layer and an inductor formed in the interconnect layer.

3 Claims, 7 Drawing Sheets

SENSOR DEVICE WITH INDUCTORS

CROSS-REFERENCE TO RELATED APPLICATIONS

The disclosure of Japanese Patent Application No. 2013-184217 filed on Sep. 5, 2013 including the specification, drawings and abstract is incorporated herein by reference in its entirety.

BACKGROUND

This invention relates to sensor devices and provides a technique applicable to, for example, a sensor device with an inductor.

Wattmeters for measuring the electric power passing through a power line use inductors. A change in the amount of current flowing through the power line makes a change in the strength of the magnetic field generated from the power line. Electric power is generated in the inductors in accordance with the change in the magnetic field strength. The wattmeters monitor the electric power to detect the amount of electric power flowing in the power line.

Generally, a wattmeter is provided with a magnetic core. The magnetic core is shaped as if it encloses the power line. However, Japanese Unexamined Patent Publication No. 2011-185914 discloses a coreless-type current sensor using a multilayer printed circuit board. In this publication, the multilayer printed circuit board is provided with a coil. This coil is formed with two different interconnect layers of the multilayer printed circuit board and vias coupling these interconnect layers. A hall IC is embedded inside the coil. The current to be detected flows through the coil.

SUMMARY

The magnetic core is used to enhance the sensitivity to the power line. However, the magnetic core causes to increase in size of the sensor and also in cost. The method described in the aforementioned publication does not require a magnetic core, but requires embedding a hall IC in the multilayer printed circuit board, and therefore cannot sufficiently reduce the cost. The inventors of the present invention searched for a new sensor device structure available with reduced cost.

The other problems and novel features of the present invention will become apparent from the following description in the present specification and the accompanying drawings.

According to an embodiment, a semiconductor device is mounted on a circuit board. The semiconductor device has an inductor. The circuit board has a first terminal, a second terminal, and an interconnect line. The second terminal is coupled to a downstream part of a power line with respect to the first terminal. The interconnect line couples the first terminal and second terminal to each other and is arranged electrically in parallel with the power line.

According to another embodiment, a semiconductor device is mounted on a circuit board. The semiconductor device has a plurality of inductors. The circuit board has a first terminal, a second terminal, and a plurality of interconnect lines. The interconnect lines couple the first terminal and second terminal to each other and are arranged in parallel with one another. As viewed in a direction perpendicular to the semiconductor device, each of the inductors is disposed adjacent to a different one of the interconnect lines.

The above-described embodiments can reduce the cost of sensor devices.

DETAILED DESCRIPTION

With reference to the accompanying drawings, embodiments will be described below. Note that in all drawings, like components are denoted by like numerals and therefore the explanations thereof will not be reiterated if not necessary.

First Embodiment

Figure 1:
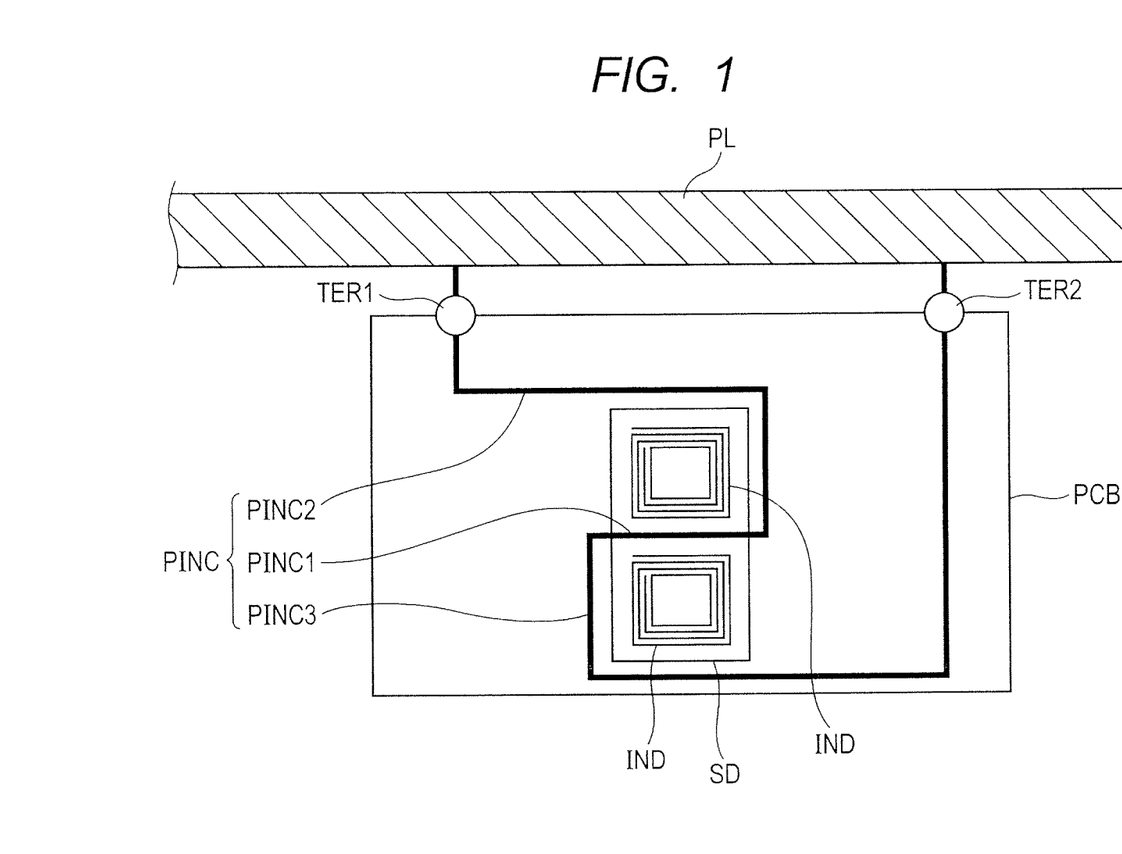
FIG. 1 illustrates the configuration of a sensor device according to the first embodiment.

FIG. 1 illustrates the configuration of a sensor device SND according to the first embodiment. The sensor device SND according to the embodiment includes a printed circuit board PCB, a first terminal TER1, a second terminal TER2, an interconnect line PINC, and a semiconductor device SD. The first terminal TER1 and second terminal TER2 are disposed on the printed circuit board PCB and coupled to a power line PL. The second terminal TER2 is coupled to a downstream part of the power line PL with respect to the first terminal TER1. The interconnect line PINC is disposed on the printed circuit board PCB to couple the first terminal TER1 and second terminal TER2 to each other. In other words, the interconnect line PINC is coupled to the power line PL in parallel. The semiconductor device SD is mounted on the printed circuit board PCB and includes an interconnect layer and an inductor IND formed in the interconnect layer.

According to the first embodiment, part of the current flowing in the power line PL passes through the interconnect line PINC. In the inductor IND, a voltage is produced that is proportional to the strength of the magnetic field generated around the interconnect line PINC. Since the interconnect line PINC is formed on the printed circuit board PCB, the distance between the interconnect line PINC and the inductor IND can be shortened. This makes it possible to enhance the sensitivity of the sensor device SND without magnetic cores. In addition, there is no need to embed an IC in the printed circuit board, thereby avoiding increases in manufacturing costs. The detailed descriptions will be given below.

The semiconductor device SD is made by placing a semiconductor chip on a chip mounting part, such as an interposer and a lead frame, and sealing the semiconductor chip and the chip mounting part with sealing resin. The semiconductor device SD has two inductors IND. When the printed circuit board PCB is viewed in a vertical direction, a part of the interconnect line PINC (first part PINC1 in this example shown in FIG. 1) is laid between the two inductors IND. The other parts of the interconnect line PINC (second part PINC2 and third part PINC3 in this example shown in FIG. 1) surround the two inductors IND.

Specifically, the semiconductor device SD has four sides in parallel with the four sides of the printed circuit board PCB, respectively. The first terminal TER1 and second terminal TER2 are disposed on one of the long sides of the printed circuit board PCB. The first terminal TER1 is coupled to one end of the first part PINC1 through the second part PINC2 of the interconnect line PINC. On the other hand, the second terminal TER2 is coupled to the other end of the first part PINC1 through the third part PINC3 of the interconnect line PINC. The second part PINC2 surrounds one of the inductors IND with the first part PINC1, while the third part PINC3 surrounds the other inductor IND with the first part PINC1.

In the illustration in FIG. 1, the inductors IND have a roughly rectangular contour. The two inductors are arranged so that a side of one inductor IND faces a side of the other inductor. The first part PINC1 of the interconnect line PINC is located between these sides. The second part PINC2 of the interconnect line PINC extends along the other three sides of the first inductor IND, while the third part PINC3 extends along the other three sides of the second inductor IND.

The interconnect line PINC is formed, for example, on an interconnect layer present at a surface of the printed circuit board PCB where the semiconductor device SD is mounted. However, the interconnect line PINC can be formed on the other interconnect layer or can be formed across a plurality of interconnect layers.

In addition, the semiconductor chip contained in the semiconductor device SD has an analog circuit and a logic circuit. These circuits are used to handle the voltage generated in the inductor IND and include, for example, an amplification unit AMP (that will be described by referring to FIG. 3).

Figure 2:
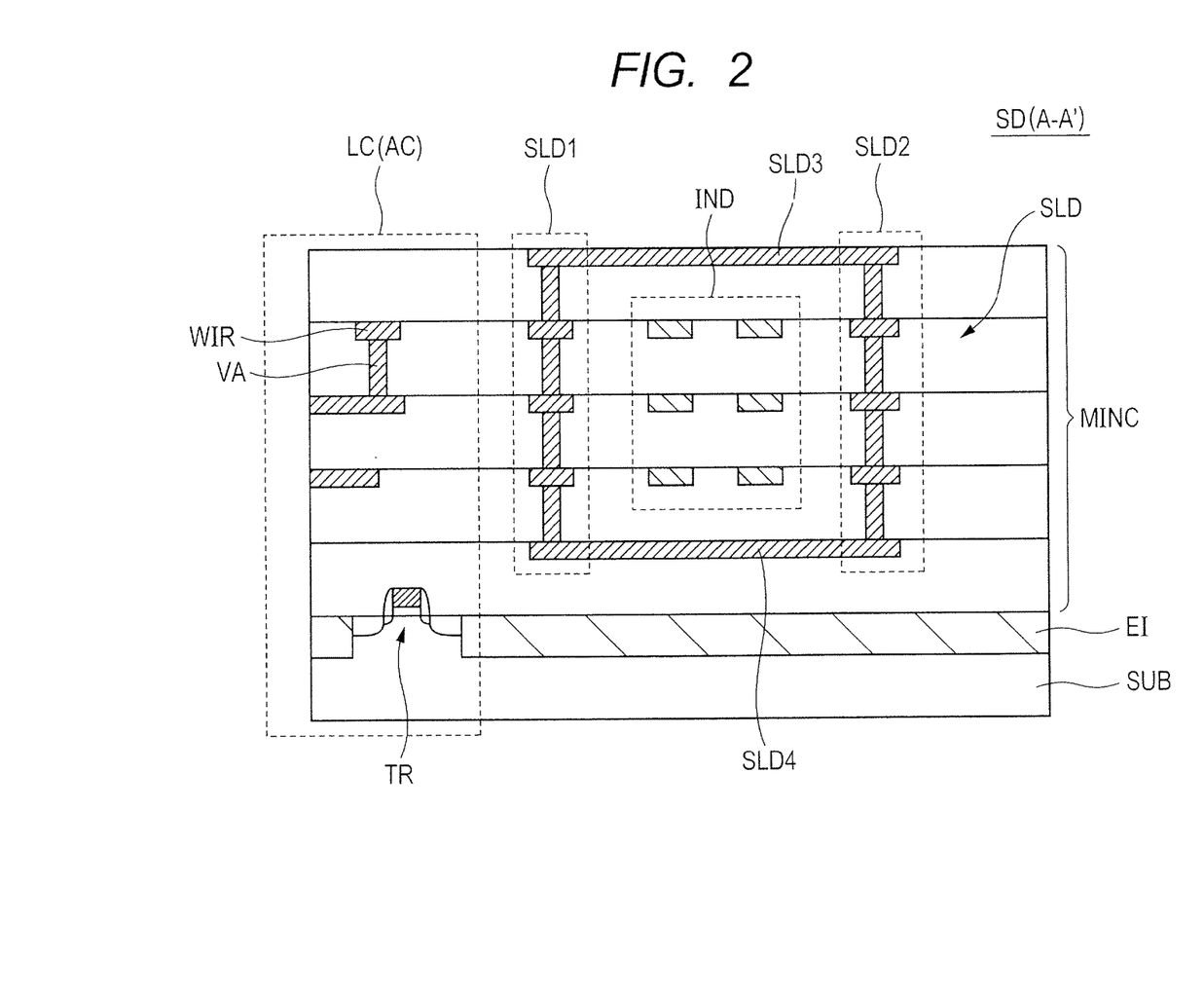
FIG. 2 is a cross-sectional view illustrating the configuration of a semiconductor chip included in a semiconductor device.

FIG. 2 is a cross-sectional view showing the configuration of the semiconductor chip contained in the semiconductor device SD. The semiconductor chip is made up with a substrate. The substrate SUB is, for example, a silicon substrate. The substrate SUB has a transistor TR and an element isolation region EI. The element isolation region EI isolates an element formation region from the other regions. The transistor TR is formed in the element formation region, for example. The transistor TR is, for example, a part of the logic circuit LC. However, the transistor TR can be a part of the analog circuit AC.

A multilevel interconnect layer MINC is formed over the transistor TR and element isolation region EI. The multilevel interconnect layer MINC has inner wires WIR. The inner wires WIR are wires used to make up the logic circuit LC or power supply wires.

The multilevel interconnect layer MINC includes a plurality of interconnect layers. Each of the interconnect layers has a sub-layer in which the inner wires WIR are formed and a sub-layer in which vias VA (or contacts) are formed. In the illustration shown in FIG. 2, the inner wires WIR are embedded in an insulating film making up the interconnect layer. However, at least one of the inner wires WIR may be formed over the insulating film making up the interconnect layer. In addition, the inner wires WIR and vias VA can be formed individually or integrally. The inner wires WIR are, for example, Cu or Al. The vias VA are, for example, Cu, Al, or W.

The inductor IND is formed in at least one of the same layers where the inner wires WIR are formed. In the illustration shown in FIG. 2, the inductor IND is formed by using a plurality of the interconnect layers (specifically, any from the second interconnect layer or higher to the interconnect layer one layer below the uppermost interconnect layer). This increases the number of turns of the inductor IND, thereby enhancing the sensitivity of detecting the change in the magnetic field created by the inductor IND.

The multilevel interconnect layer MINC is provided with a shield member SLD. The shield member SLD encloses the inductor IND to prevent the inductor IND from being a noise source for the logic circuit LC and analog circuit AC and to prevent the logic circuit LC from being a noise source for the inductor IND and analog circuit AC.

More specifically, the shield member SLD includes a first shield member SLD1, a second shield member SLD2, a third shield member SLD3, and a fourth shield member SLD4.

The first shield member SLD1 is located between the inductor IND and the logic circuit LC (or analog circuit AC), while the second shield member SLD2 is located opposite to the first shield member SLD1 via the inductor IND. Both the first shield member SLD1 and second shield member SLD2 are continuously formed from the interconnect layer below the interconnect layer in which the inductor IND is formed to the interconnect layer above the interconnect layer in which the inductor IND is formed. At any interconnect layers, the first shield member SLD1 and second shield member SLD2 have a metal layer located on the same level as the sub-layer where the inner wire WIR is formed, and a metal layer located on the same level as the sub-layer where the via VA is formed.

The third shield member SLD3 is formed in the interconnect layer one layer above the interconnect layer where the inductor IND is formed. The fourth shield member SLD4 is formed in the interconnect layer one layer below the interconnect layer where the inductor IND is formed. The third shield member SLD3 is used to couple the uppermost metal layer of the first shield member SLD1 and the uppermost metal layer of the second shield member SLD2 and also covers the inductor IND from above. The fourth shield member SLD4 is used to couple the lowermost metal layer of the first shield member SLD1 and the lowermost metal layer of the second shield member SLD2 and also covers the inductor IND from beneath. The inductor IND is enclosed by the first shield member SLD1, third shield member SLD3, second shield member SLD2, and fourth shield member SLD4.

Figure 3:
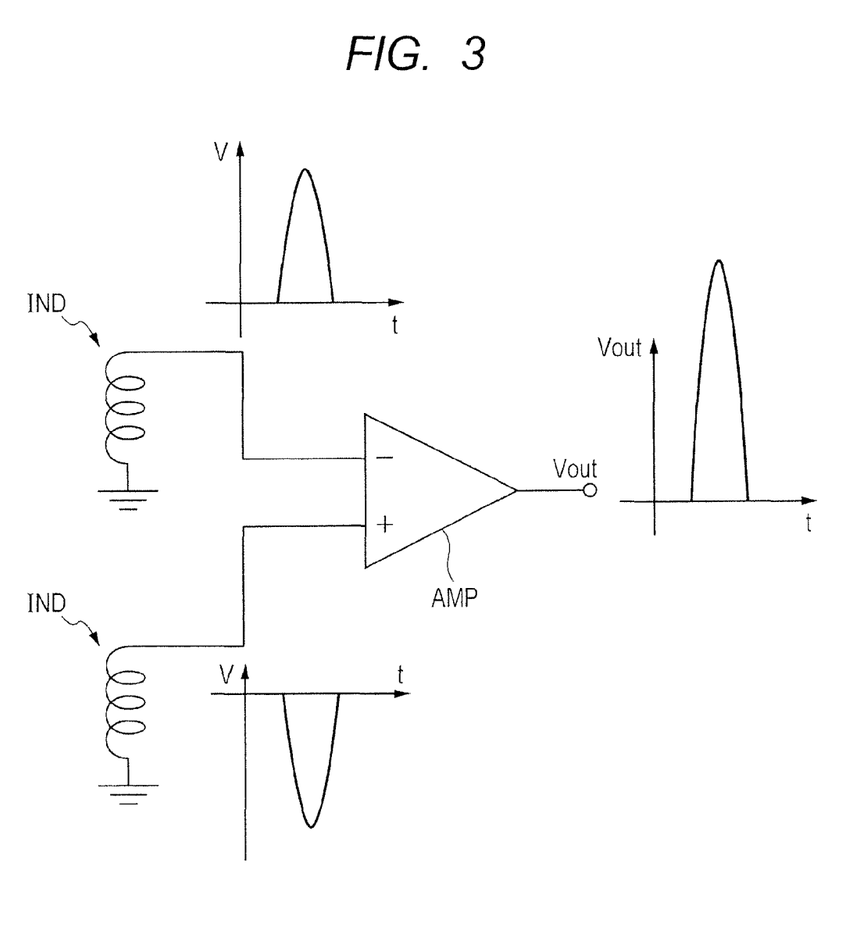
FIG. 3 illustrates the connectivity relationship between an amplifier unit contained in a circuit and an inductor.

FIG. 3 illustrates the connectivity relationship between the amplification unit AMP contained in a circuit mounted on the semiconductor device SD and the inductor IND. In the illustration shown in FIG. 3, the amplification unit AMP is an operational amplifier. When an electric current flows into the interconnect line PINC, a positive voltage signal is produced in one of the inductors IND, while a negative voltage signal is produced in the other inductor IND. Inputting these two signals to the amplification unit AMP produces a higher output in comparison with the case where only one inductor IND is coupled to the amplification unit AMP.

Figure 4A:
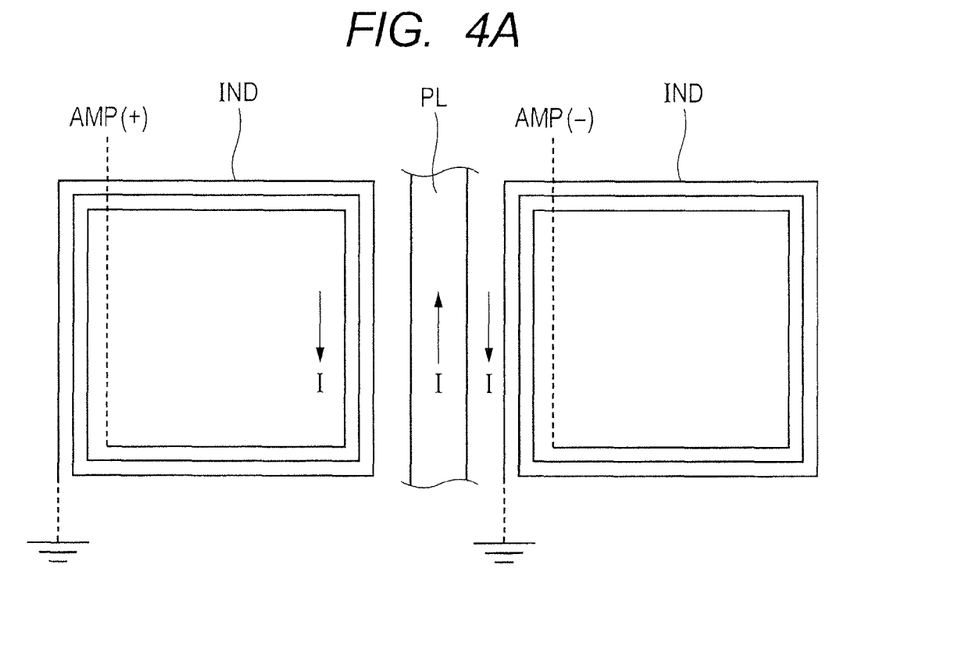
FIG. 4A illustrates the first example of the winding direction of two inductors.

FIG. 4A shows the first example of the winding direction of the two inductors IND. In the example shown in FIG. 4A, the two inductors IND are wound in the same manner. An inner end of the first inductor IND is coupled to a positive input terminal of the amplification unit AMP, while the inner end of the second inductor IND is coupled to a negative input terminal of the amplification unit AMP. On the other hand, the outer ends of the two inductors IND are grounded.

Figure 4B:
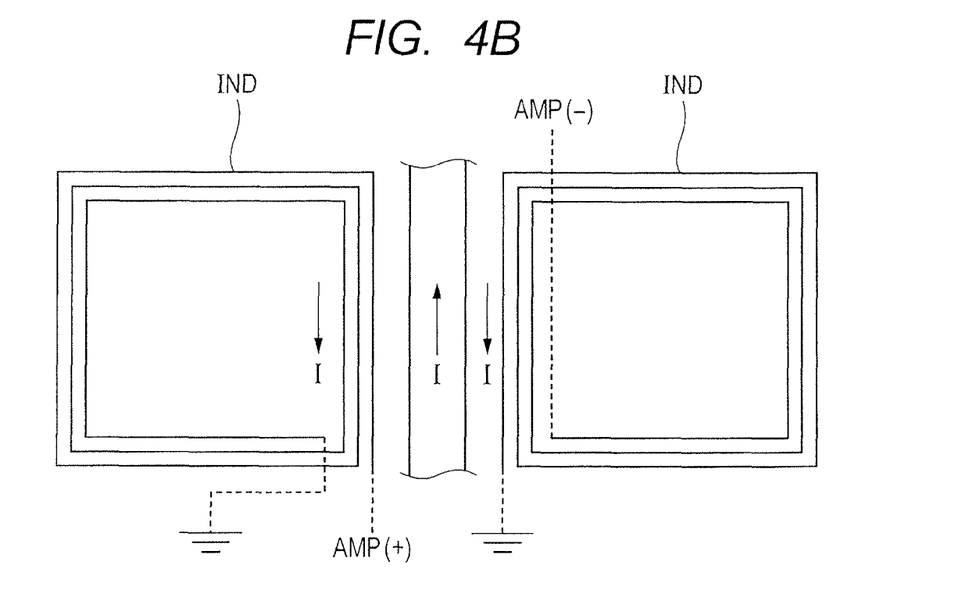
FIG. 4B illustrates the second example of the winding direction of the two inductors.

FIG. 4B shows the second example of the winding direction of the two inductors IND. In the example shown in FIG. 4B, the two inductors IND are wound in opposite directions to each other. An inner end of the first inductor IND is coupled to one input terminal of the amplification unit AMP (e.g., negative input terminal), while the outer end of the second inductor IND is coupled to the other input terminal of the amplification unit AMP (e.g., positive input terminal). In addition, the outer end of the first inductor IND is grounded, and the inner end of the second inductor IND is also grounded.

According to the embodiment, part of the current flowing in the power line PL passes through the interconnect line PINC. Since the interconnect line PINC is formed on the printed circuit board PCB, the distance between the interconnect line PINC and the inductor IND can be shortened. This makes it possible to enhance the sensitivity of the sensor device SND without magnetic cores. In addition, there is no need to embed an IC in the printed circuit board, thereby avoiding increases in manufacturing costs.

Furthermore, the interconnect line PINC is extended between the two inductors IND. Due to the magnetic field generated around the interconnect line PINC, the two inductors IND induce electromotive forces, respectively. Combining the two electromotive forces can increase the strength of the signal that represents the amount of current flowing through the power line PL.

Especially, in this embodiment, the interconnect line PINC surrounds each of the two inductors IND. This arrangement increases the sensitivity of detecting the change in the magnetic field generated by the inductor IND around the interconnect line PINC.

Second Embodiment

Figure 5:
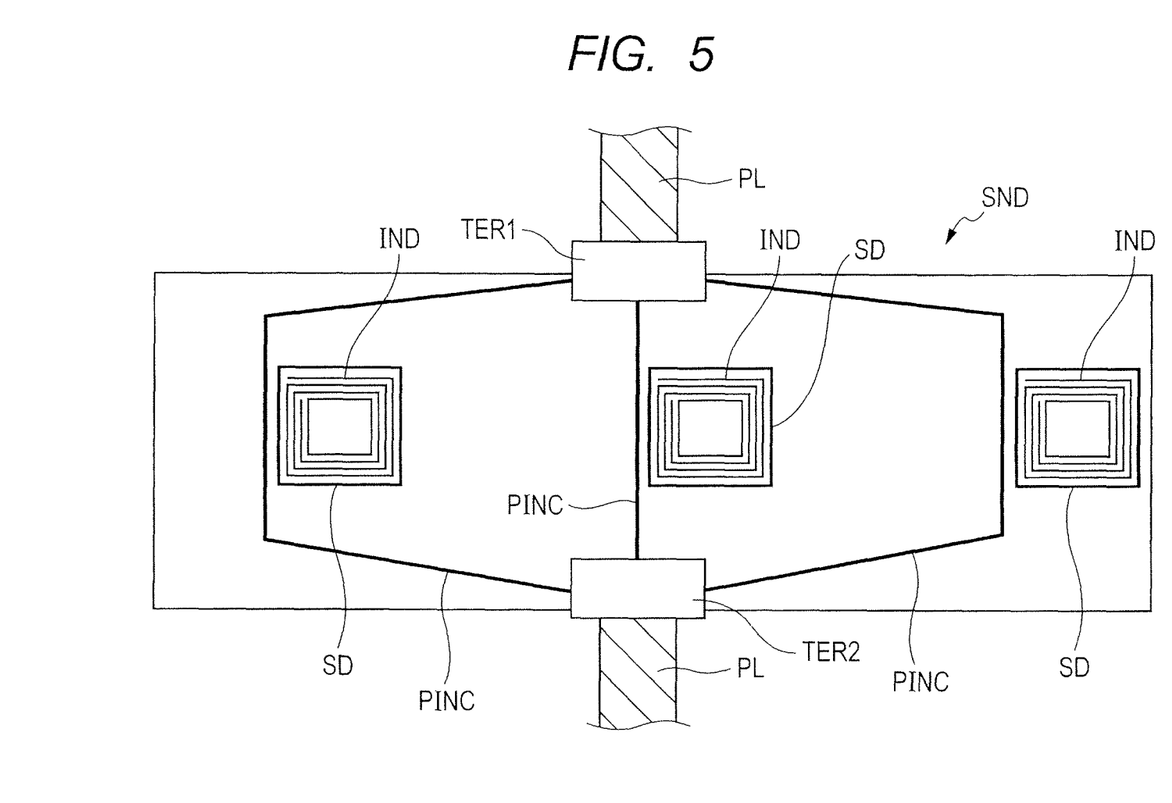
FIG. 5 is a plan view illustrating the configuration of a sensor device according to the second embodiment.

FIG. 5 is a plan view illustrating the configuration of a sensor device SND according to the second embodiment. The sensor device SND according to the embodiment has the same configuration as the sensor device SND of the first embodiment except for the following.

First, a power line PL is split into two parts, an upstream part and a downstream part. Second, a first terminal TER1 is coupled to the upstream part of the power line PL, while a second terminal TER2 is coupled to the downstream part of the power line PL. In other words, the interconnect line PINC functions as a part of the power line PL and couples the upstream part and the downstream part of the power line PL.

In addition, a printed circuit board PCB has a plurality of interconnect lines PINC coupled in parallel. Every interconnect line PINC couples the first terminal TER1 and second terminal TER2. Therefore, the amount of current flowing in the individual interconnect lines PINC is small. Thus, concentrated flow of current in a specific interconnect line PINC can be prevented.

There are a plurality of semiconductor devices SD on the printed circuit board PCB. The semiconductor devices SD, each having an inductor IND, are arranged in the vicinity of different interconnect lines PINC, respectively. The semiconductor devices SD have a logic circuit that produces a signal representing the amount of current flowing through the power line PL by adding up (or averaging) detected values of the respective inductors IND.

Figure 6:
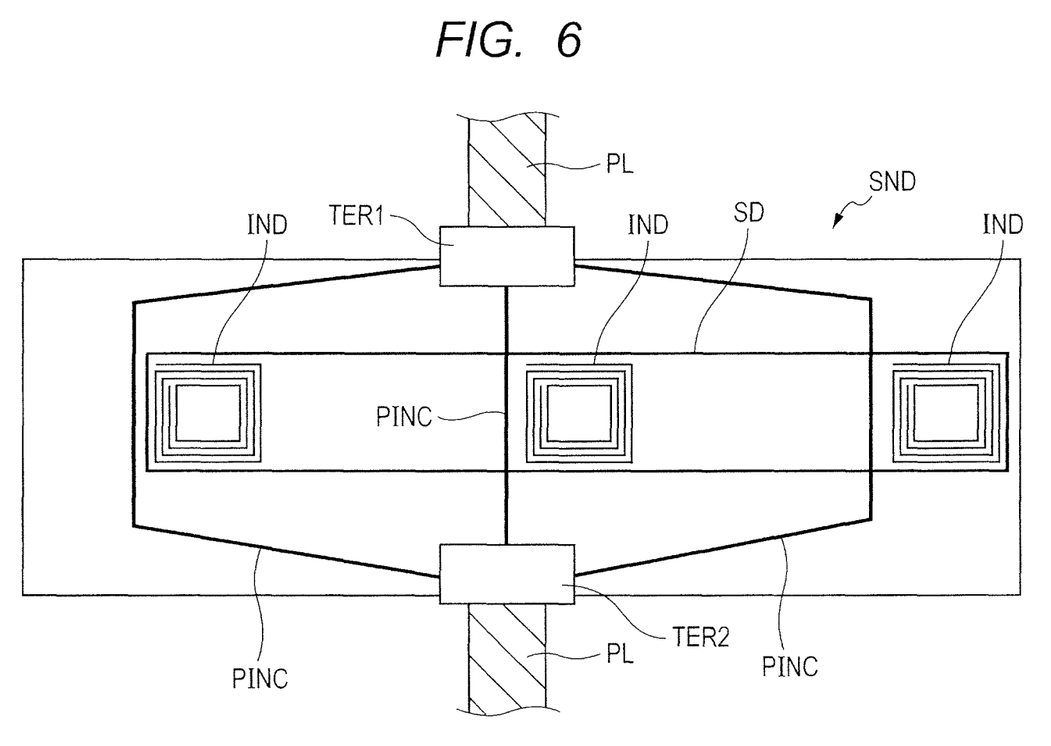
FIG. 6 is a plan view showing a modification of FIG. 5.

In the second embodiment, as shown in FIG. 6, there is no problem that a single semiconductor device SD contains a plurality of inductors IND.

According to the embodiment, the current flowing through the power line PL is distributed to a plurality of the interconnect lines PINC. Each of the inductors IND induces a voltage in accordance with the amount of the current flowing through the interconnect line PINC adjacent to the inductor IND. Then, the logic circuit of the semiconductor device SD adds up the detected values of the inductors IND to produce a signal representing the amount of the current flowing through the power line PL. Furthermore, the distance between the inductors IND and interconnect lines PINC is short. This makes it possible to enhance the sensitivity of the sensor device SND without magnetic cores. In addition, there is no need to embed an IC in the printed circuit board, thereby avoiding increases in manufacturing costs.

Third Embodiment

Figure 7:
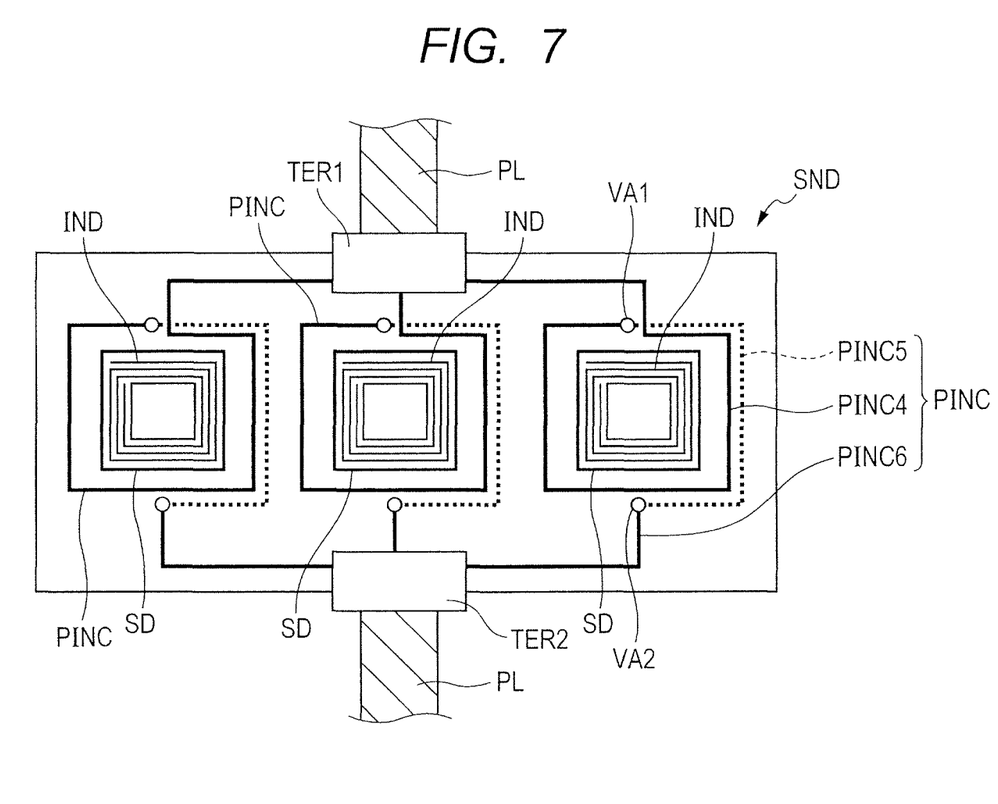
FIG. 7 is a plan view illustrating the configuration of a sensor device according to the third embodiment.

FIG. 7 is a plan view illustrating the configuration of a sensor device SND according to the third embodiment. The sensor device SND according to the embodiment has the same configuration as the sensor device SND of the second embodiment, except that, in plan view, interconnect lines PINC enclose the peripheries of the inductors IND.

The interconnect line PINC that is routed on a surface (first surface), on which a semiconductor device SD is mounted, of the printed circuit board PCB is partially routed onto a surface (second surface) opposite to the first surface through a via. In plan view, the part of the interconnect line PINC routed on the second surface intersects the part of the interconnect line PINC routed on the first surface. This routing allows the interconnect line PINC to enclose the semiconductor device SD without gaps.

Specifically, the interconnect line PINC includes a fourth part PINC4, a fifth part PINC5, and a sixth part PINC6. The fourth part PINC4 is located on the first surface of the printed circuit board PCB and has one end coupled to the first terminal TER1. In addition, the fourth part PINC4 encloses the four sides of the semiconductor device SD. The fifth part PINC5 is located on the second surface of the printed circuit board PCB and intersects the fourth part PINC4 in plan view. One end of the fifth part PINC5 is coupled to the other end of the fourth part PINC4 through a via VA1. One end of the sixth part PINC6 is coupled to the other end of the fifth part PINC5 through a via VA2. The other end of the sixth part PINC6 is coupled to the second terminal TER2.

The third embodiment can also provide the same effects as those of the second embodiment. In addition, the interconnect lines PINC enclosing the semiconductor devices SD without gaps enhance the sensitivity of detecting the change in magnetic field created by the inductors IND around the interconnect lines PINC.

It should be further understood by those skilled in the art that although the foregoing description has been made on embodiments of the invention, the invention is not limited thereto and various changes and modifications may be made without departing from the spirit of the invention and the scope of the appended claims.

What is claimed is:

1. A sensor device comprising:
a circuit board;
a first terminal provided on the circuit board;
a second terminal provided on the circuit board;
a plurality of interconnect lines provided on the circuit board, each one of the plurality of interconnect lines coupling the first terminal and the second terminal to each other, and the plurality of interconnect lines being arranged electrically in parallel with one another;
at least one semiconductor device mounted on the circuit board; and a plurality of inductors provided on the semiconductor device, wherein as viewed in a direction perpendicular to the semiconductor device, each one of the plurality of inductors is disposed adjacent to a different one of the plurality of interconnect lines, and each one of the plurality of interconnect lines surrounds a different one of the inductors, wherein at least one of the plurality of interconnect lines has a first portion provided in a first layer of the semiconductor device and a second portion provided in a second layer of the semiconductor device, the first and second portions being interconnected so that the one interconnected lines encloses a corresponding inductor without a gap.

2. The sensor device of claim 1, further comprising shield members enclosing the inductors.

3. The sensor device of claim 1, wherein the plurality of interconnect lines enclose the peripheries of corresponding inductors.

* * * * *